United States Patent
Wang et al.

(10) Patent No.: US 8,334,725 B2
(45) Date of Patent: Dec. 18, 2012

(54) CIRCUIT AND METHOD FOR CONTROLLING MIXED MODE CONTROLLED OSCILLATOR AND CDR CIRCUIT USING THE SAME

(75) Inventors: Ping-Ying Wang, Hsinchu (TW);
Kuan-Hua Chao, Tainan County (TW);
Jeng-Horng Tsai, Kao-Hsiung (TW)

(73) Assignee: Mediatek Inc., Hsin-Chu (TW)

( * ) Notice: Subject to any disclaimer, the term of this patent is extended or adjusted under 35 U.S.C. 154(b) by 25 days.

(21) Appl. No.: 12/060,315

(22) Filed: Apr. 1, 2008

(65) Prior Publication Data
US 2008/0253492 A1 Oct. 16, 2008

Related U.S. Application Data (60) Provisional application No. 60/911,090, filed on Apr. 11, 2007.

(51) Int. Cl.
*H03L 7/00* (2006.01)

(52) U.S. Cl. ......... 331/16; 331/1 A; 331/1 R; 331/17; 331/34; 331/36 C; 331/36 R; 331/177 R; 331/10; 375/376

(58) Field of Classification Search ............... 331/1 A, 331/1 R, 16, 17, 34, 36 C, 36 R, 177 R, 10; 375/376

See application file for complete search history.

(56) References Cited

U.S. PATENT DOCUMENTS

| 5,563,553 | A  | * | 10/1996 | Jackson ................... 331/57 |
| 5,696,468 | A  | * | 12/1997 | Nise ....................... 331/14 |
| 5,942,949 | A  | * | 8/1999  | Wilson et al. ............. 331/17 |
| 5,978,425 | A  |   | 11/1999 | Takla |
| 6,268,778 | B1 | * | 7/2001  | Mucke et al. ........... 331/117 R |
| 6,674,824 | B1 |   | 1/2004  | Chiueh et al. |
| 6,683,502 | B1 | * | 1/2004  | Groen et al. ............. 331/17 |
| 6,791,425 | B2 |   | 9/2004  | Kitamura |
| 6,870,411 | B2 | * | 3/2005  | Shibahara et al. ......... 327/156 |
| 7,095,287 | B2 | * | 8/2006  | Maxim et al. ............. 331/44 |
| 7,127,022 | B1 |   | 10/2006 | Dieguez |
| 2006/0214737 | A1 | * | 9/2006  | Brown et al. ............. 331/16 |
| 2006/0261870 | A1 | * | 11/2006 | Hayashida ................ 327/158 |
| 2008/0111638 | A1 | * | 5/2008  | Thaller .................. 331/57 |
| 2008/0111641 | A1 | * | 5/2008  | Huang et al. ............. 331/1 A |

OTHER PUBLICATIONS

Taiwanese language office action dated Sep. 19, 2011.

* cited by examiner

*Primary Examiner* — Arnold Kinkead
*Assistant Examiner* — Richard Tan
(74) *Attorney, Agent, or Firm* — McClure, Qualey & Rodack, LLP (57) ABSTRACT

A circuit for controlling a mixed mode controlled oscillator. The circuit comprises a charge pump, and a digital loop filter. The charge pump is coupled to the mixed mode controlled oscillator. The charge pump receives an up/down signal and sends a current signal to the mixed mode controlled oscillator. The digital loop filter receives the up/down signal and generates a digital code signal to the mixed mode controlled oscillator. An output frequency of the mixed mode controlled oscillator is controlled by the current signal and the digital code signal.

15 Claims, 15 Drawing Sheets

CIRCUIT AND METHOD FOR CONTROLLING MIXED MODE CONTROLLED OSCILLATOR AND CDR CIRCUIT USING THE SAME

CROSS REFERENCE TO RELATED APPLICATIONS

This application claims the benefit of U.S. Provisional Application No. 60/911,090, filed on Apr. 11, 2007.

BACKGROUND OF THE INVENTION

1. Field of the Invention

The invention relates to a clock data recovery (CDR) circuit and, in particular, to a mixed mode controlled oscillator base CDR circuit.

2. Description of the Related Art

A clock data recovery circuit plays an important role in high speed Serializer/Deserializer (SERDES) design. With greater demand for lower chip costs and more highly integrated designs, requirements for reduced chip area and power has resulted in adoption of more advanced process technologies. Nevertheless, for a conventional analog CDR circuit, area and power do not scale well with process because core devices therein can not be used as loop filters due to gate oxide current leakage, as the leakage makes the control voltage of the loop filters unstable during the absence of incoming data. In addition, generally, designing analog circuits with low voltage consumes more area and current.

Recently, all digital CDR solutions have been published, which attempt to resolve the above-mentioned problems. Drawbacks of the all digital CDR solutions are (1) difficulties in scaling with process due to requirement for the multiple phase generator, which is an analog circuit, typically a PLL or DLL, (2) phase quantization error, (3) greater area and power consumption due to the requirement for the phase interpolator to generate smaller phase resolution, and (4) loop latency.

BRIEF SUMMARY OF THE INVENTION

An embodiment of a circuit for controlling a mixed mode controlled oscillator comprises a charge pump, and a digital loop filter. The charge pump is coupled to the mixed mode controlled oscillator. The charge pump receives an up/down signal and sends a current signal to the mixed mode controlled oscillator. The digital loop filter receives the up/down signal and generates a digital code signal to the mixed mode controlled oscillator. An output frequency of the mixed mode controlled oscillator is controlled by the current signal and the digital code signal.

An embodiment of a method for controlling a mixed mode controlled oscillator comprises providing an up/down signal, generating a current signal by a charge pump according to the up/down signal, generating a digital code signal by a digital loop filter according to the up/down signal, and controlling an output frequency of the mixed mode controlled oscillator based on the current signal and the digital code signal.

An embodiment of a clock data recovery (CDR) circuit comprises a phase detector, a digital loop filter, a mixed mode controlled oscillator, a charge pump, and a coarse tuning control unit. The phase detector generates an up/down signal. The digital loop filter receives the up/down signal and generates a digital code signal. The mixed mode controlled oscillator receives the digital control code. The charge pump is coupled to the mixed mode controlled oscillator. The charge pump sends a current signal to the mixed mode controlled oscillator according to the up/down signal. The coarse tuning control unit is coupled to the mixed mode controlled oscillator. The coarse tuning control unit coarsely tunes an output frequency of the mixed mode controlled oscillator. The output frequency of the mixed mode controlled oscillator is controlled by the current signal, the coarse tuning control unit, and the digital control code.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 4:
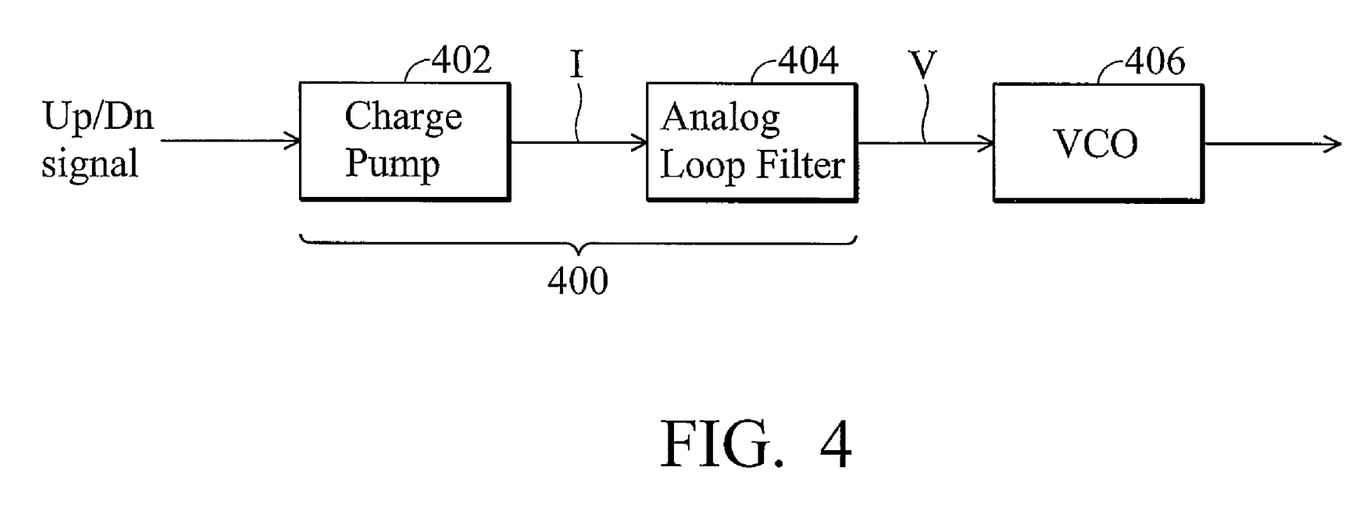
FIG. 4 shows a circuit for controlling a voltage controlled oscillator (VCO)
Figure 5:
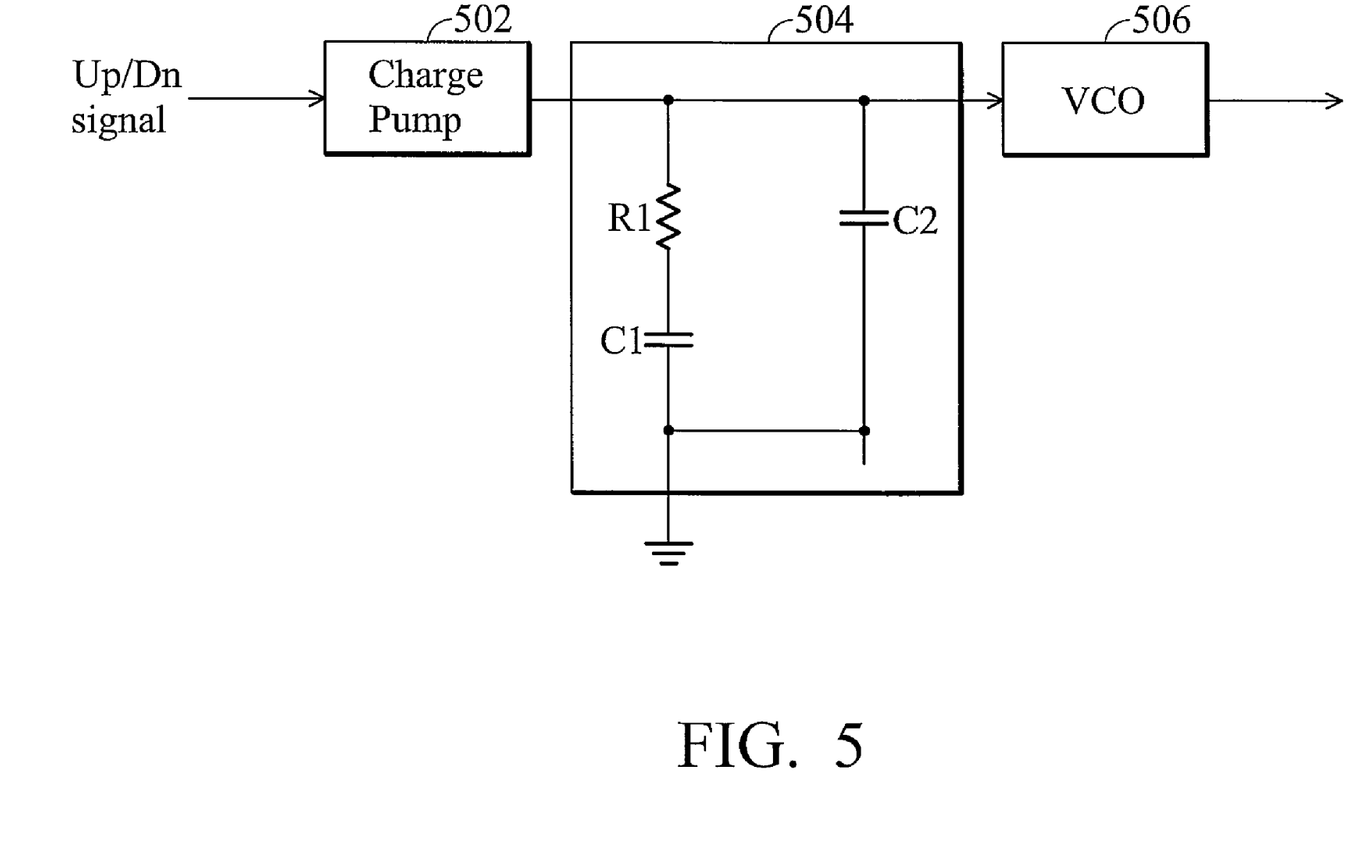
FIG. 5 shows an embodiment of the circuit 400.

FIG. 4 shows a circuit for controlling a voltage controlled oscillator (VCO). With reference to FIG. 4, the circuit 400 comprises a charge pump 402 and an analog loop filter 404. The charge pump 402 sources or sinks a current I to/from the analog loop filter 404 according to an up/down signal. The analog loop filter 404 converts the current into a voltage V to control the VCO 406. The frequency of oscillation signal outputted by the VCO 406 is determined by the voltage V. FIG. 5 shows an embodiment of the circuit 400. The charge pump 502 and the VCO 506 are the same as the charge pump 402 and the VCO 406 shown in FIG. 4. The analog loop filter 504 can be implemented by a resistor R1, a first capacitor C1, and a second capacitor C2. The resistor R1 provides a proportional gain to the VCO 506. The first capacitor C1 provides an integral gain to the VCO 506. However, capacitors (such as C1) occupy a large area in an integrated circuit. Therefore, digitally controlled oscillators are provided to avoid implementing capacitors.

Figure 6:
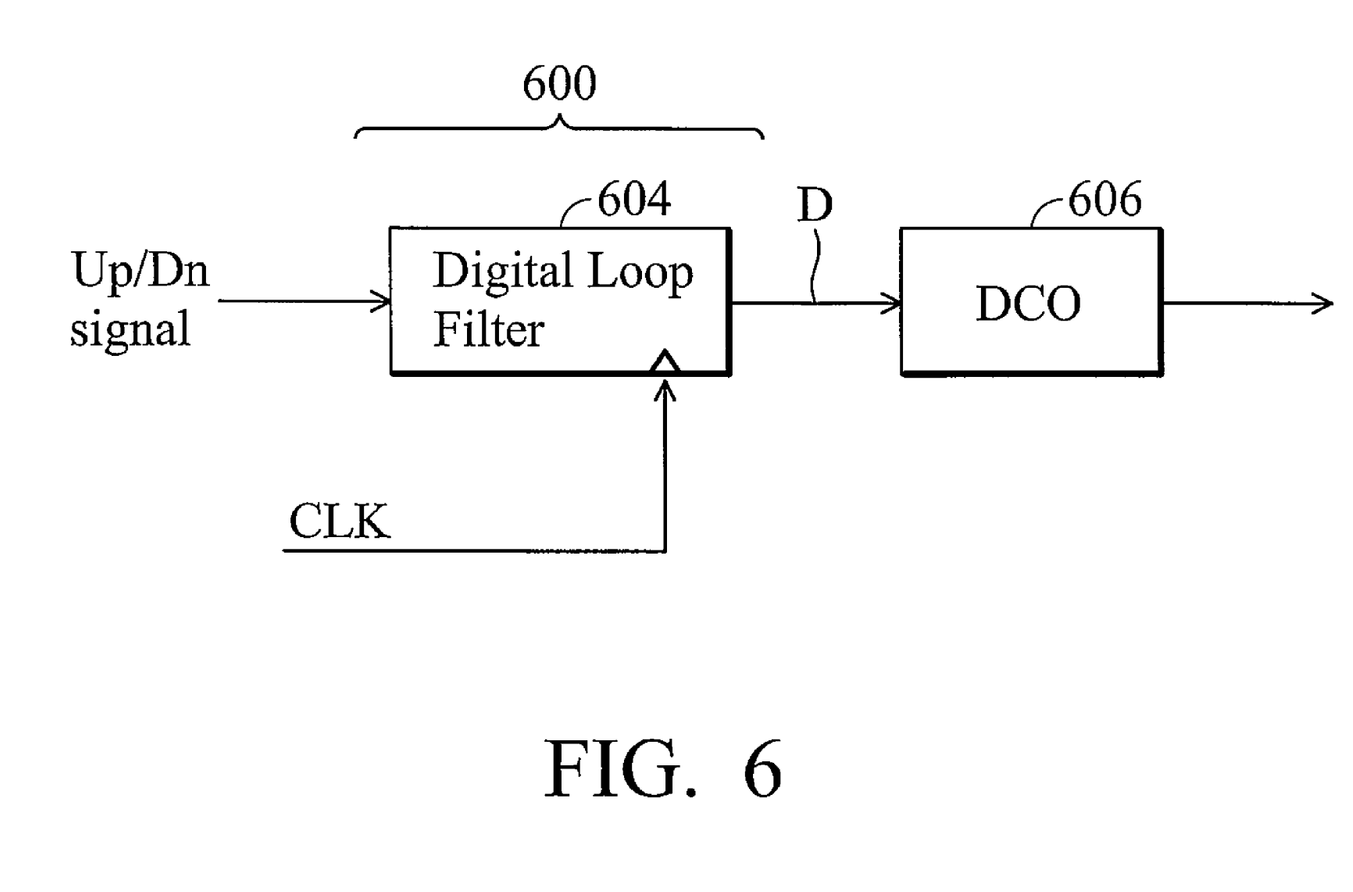
FIG. 6 shows an embodiment of a circuit for controlling a digitally controlled oscillator (DCO)

FIG. 6 shows an embodiment of a circuit for controlling a digitally controlled oscillator (DCO). The circuit 600 for controlling the DCO 606 is implemented by a digital loop filter 604. The up/down signal is processed by the digital loop filter 604 to generate a digital code D. The frequency of oscillation signal outputted by the DCO 606 is determined by the digital code D. The digital code D contains both proportional and integral information. In this embodiment, most circuits are implemented in digital domain. Digital operations can be synchronous or non-synchronous. If the operations are synchronous, there must be delays of several clock cycles from the up/down signal to the digital code D. Therefore, the DCO 606 cannot respond very quickly to the up/down signal. It may cause problems in some applications. A dual controlled oscillator is disclosed to overcome the above-mentioned problems.

Figure 7:
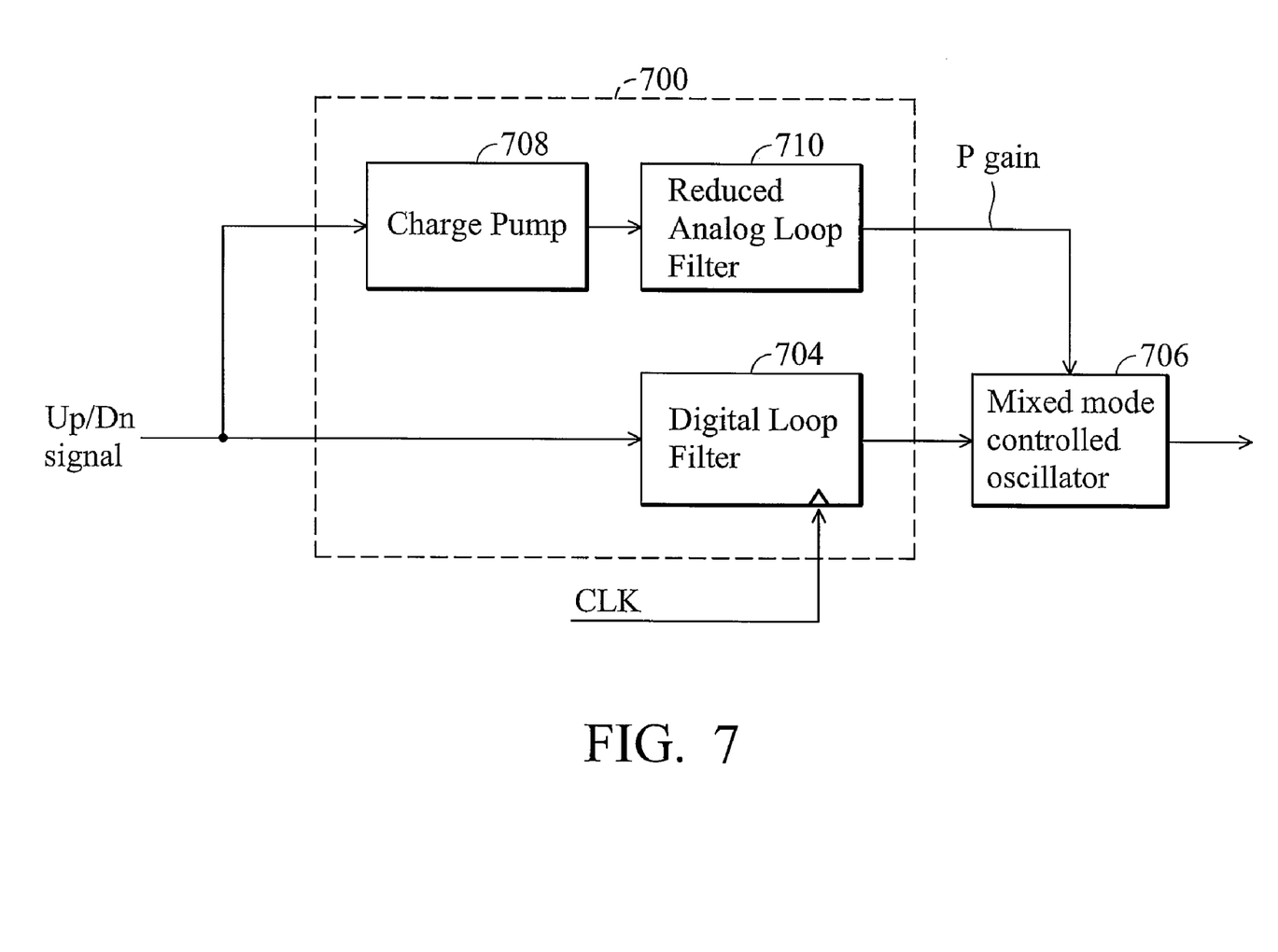
FIG. 7 shows an embodiment of a circuit for controlling a mixed mode controlled oscillator.

FIG. 7 shows an embodiment of a circuit for controlling a mixed mode controlled oscillator. The circuit 700 for controlling a mixed mode controlled oscillator 706 comprises a charge pump 708, a reduced analog loop filter 710, and a digital loop filter 704. The path from the charge pump 708, the reduced analog loop filter 710, to the mixed mode controlled oscillator 706 is an analog proportional gain (P gain) path, providing an analog signal to control the mixed mode controlled oscillator 706. The path from the digital loop filter 704 to the mixed mode controlled oscillator 706 is a digital integral gain (I gain) path, providing a digital signal to control the mixed mode controlled oscillator 706. The charge pump 708 and the reduced analog loop filter 710 are used to shorten the response time from the up/down signal to the output of the mixed mode controlled oscillator 706. An analog integral gain path can occupy a large area because of capacitors. So in this embodiment, the integral gain path is implemented by digital circuits. The reduced analog loop filter 710 is a simple version of analog loop filter, and can be implemented by a resistor or a capacitor.

Figure 12:
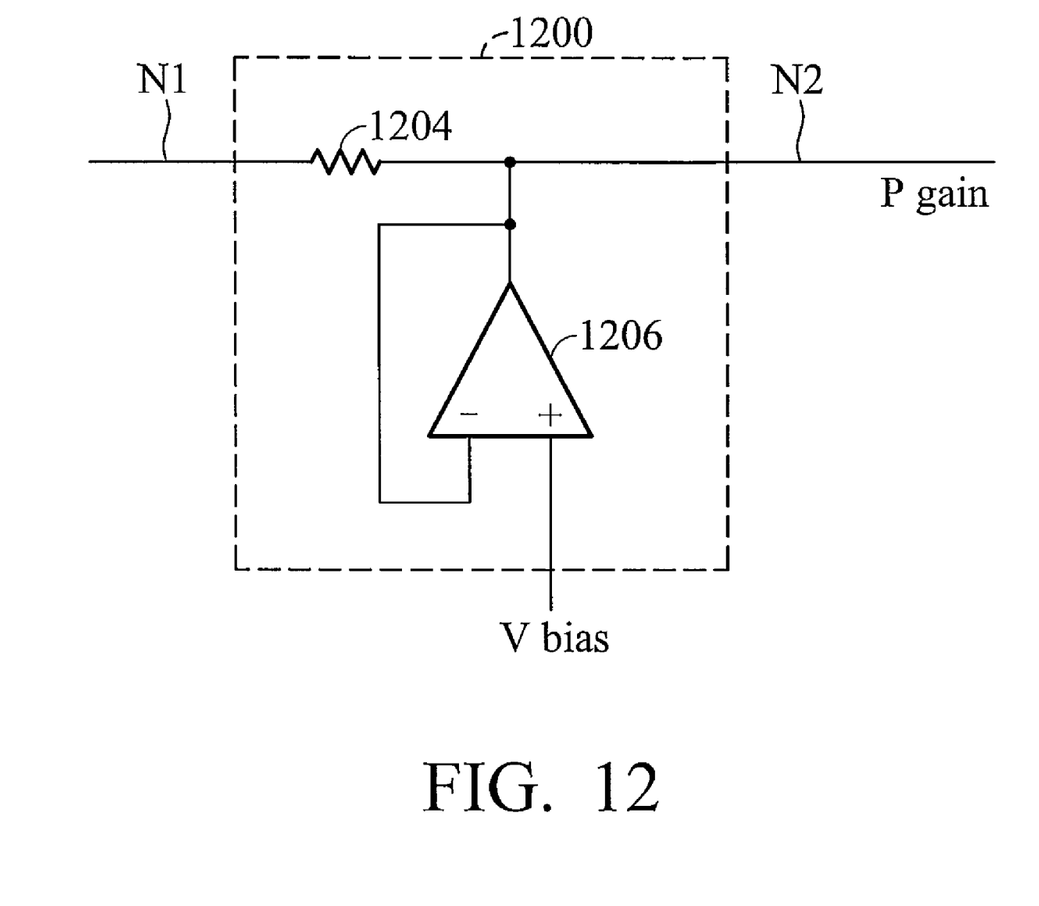
FIG. 12 shows an embodiment of a reduced analog loop filter.

FIG. 12 shows an embodiment of a reduced analog loop filter. The reduced analog loop filter 1200 comprises a resistor 1204 and an operational amplifier 1206. The operational amplifier 1206 is coupled to the resistor 1204 through an output of the operational amplifier 1206. An inverting terminal of the operational amplifier 1206 is coupled to the output. A non-inverting terminal of the operational amplifier 1206 is coupled to a bias voltage V bias. A node N1 and a node N2 are respectively coupled to a charge pump and a mixed mode controlled oscillator.

Figure 8:
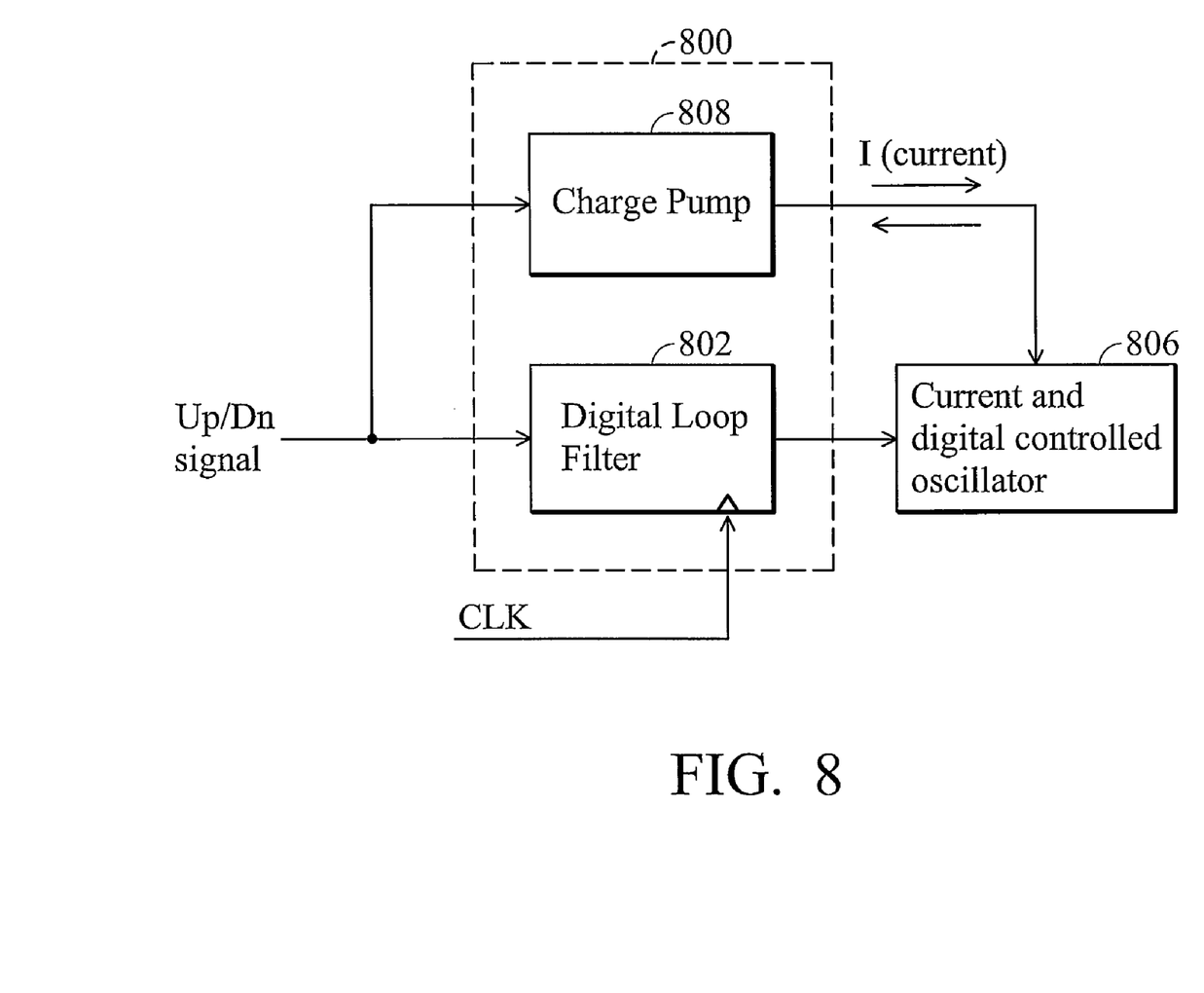
FIG. 8 shows an embodiment of a circuit for controlling a mixed mode controlled oscillator.

FIG. 8 shows an embodiment of a circuit for controlling a mixed mode controlled oscillator. The circuit 800 for controlling a mixed mode controlled oscillator 806 comprises a charge pump 808, and a digital loop filter 804. In this embodiment, the mixed mode controlled oscillator 806 is implemented by a current controlled and digital controlled oscillator, so the charge pump 808 can directly sources a current into the mixed mode controlled oscillator 806 or sinks the current from the mixed mode controlled oscillator 806. A reduced analog loop filter (such as 710) is not needed.

Figure 9:
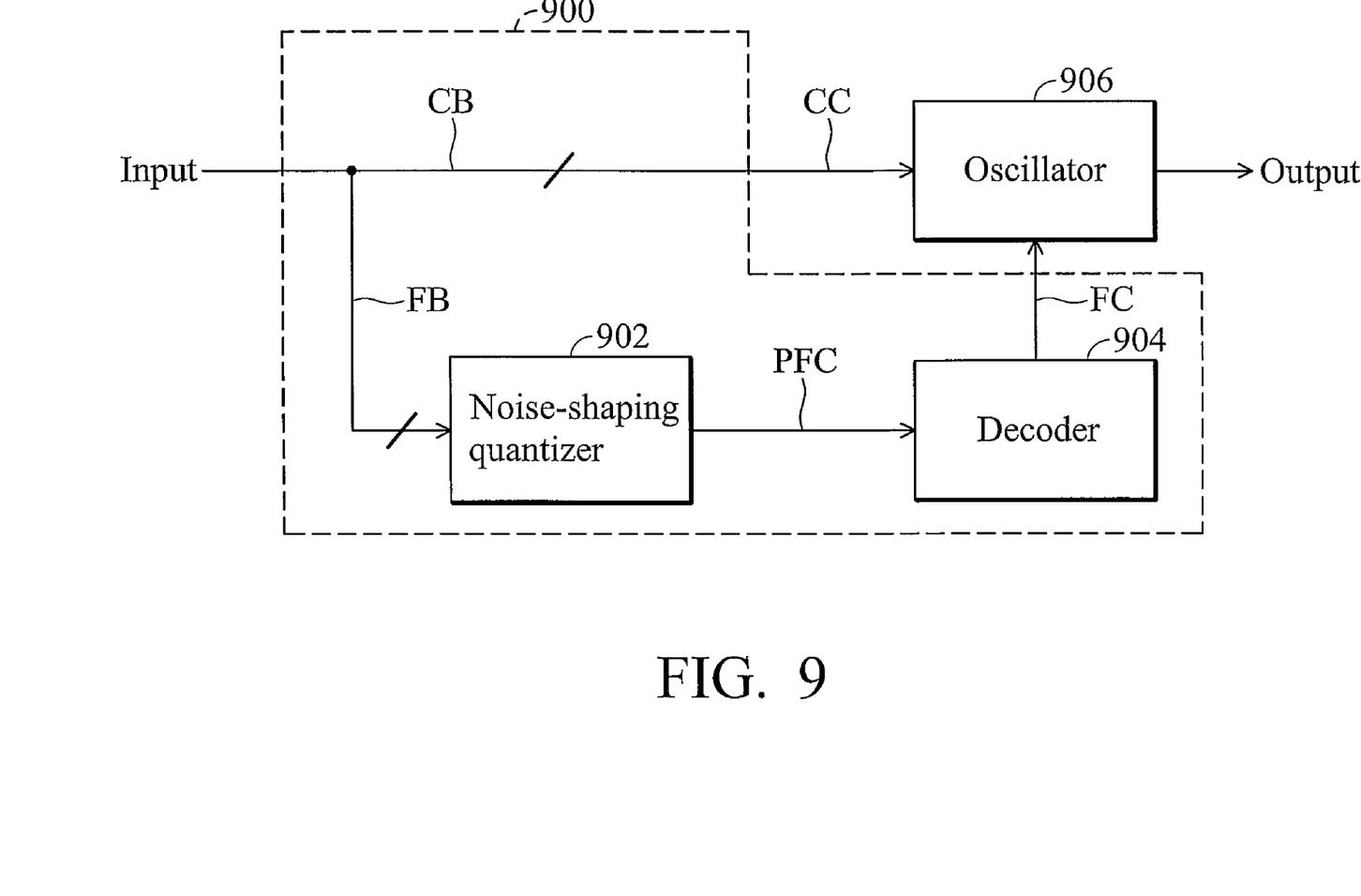
FIG. 9 shows an embodiment of a circuit for providing digital control codes to control an oscillator.

FIG. 9 shows an embodiment of a circuit for providing digital control codes to control an oscillator. The circuit 900 comprises a noise-shaping quantizer 902 and a decoder 904. When a high resolution control of the oscillator 906 is desired, the input may contain multiple bits. The input of the circuit 900 is the result of an up-down counter (such as the up-down counter shown in FIG. 11). The up-down counter counts up or down according to an up/down signal. The input is divided into coarse bit signal CB and fine bit signal FB. For example, for an input [n:0], the coarse bit signal CB can be [n:m] and the fine bit signal FB can be [m-1:0]. The coarse bit signal CB is used as a coarse control (CC) signal to directly control the oscillator 906. The fine bit signal FB is inputted into the noise-shaping quantizer 902. After noise-shaping operations, the noise-shaping quantizer 902 outputs a pre-fine control (PFC) signal to the decoder 904. The decoder 904 further decodes the PFC signal and then outputs a fine control (FC) signal to the oscillator 906. Because the oscillator 906 is separately controlled by the CC signal and the FC signal, it may cause non-monotonic problem.

Figure 10:
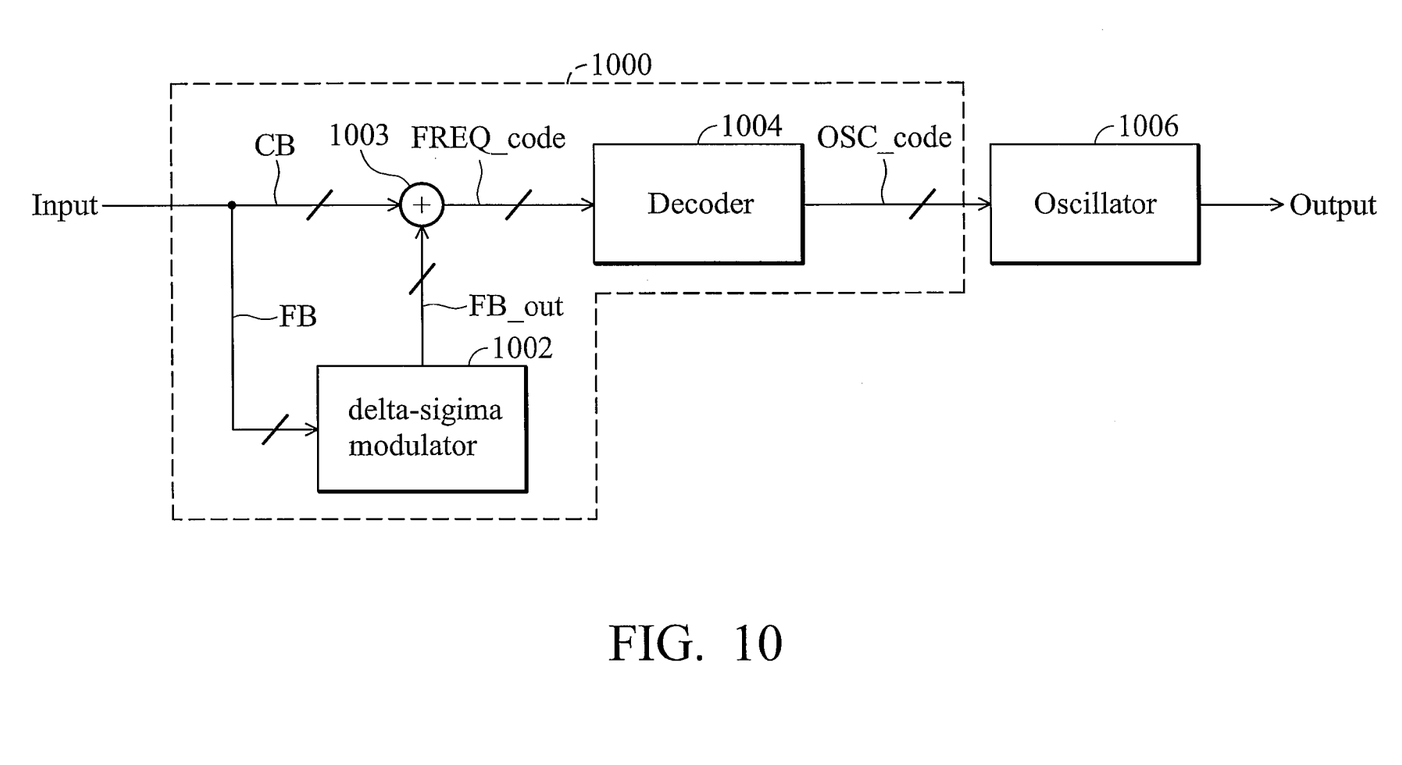
FIG. 10 shows an embodiment of a circuit for providing digital control codes to control an oscillator.

FIG. 10 shows an embodiment of a circuit for providing digital control codes to control an oscillator. The circuit 1000 for providing digital control codes to control an oscillator 1006 comprises a delta-sigma modulator 1002, an adder 1003, and a decoder 1004. The input is divided into coarse bit signal CB and fine bit signal FB. For example, for an input [n:0], the coarse bit signal CB can be [n:m] and the fine bit signal FB can be [m-1:0]. The fine bit signal FB is inputted into a noise-shaping quantizer, such as a delta-sigma modulator 1002. The output signal FB_out of the delta-sigma modulator 1002 is added to the coarse bit signal CB to generate a FREQ_code signal. The decoder 1004 receives the FREQ_code signal to generate an oscillator control code signal OSC_code signal. The OSC_code signal is used to control the oscillator 1006.

Because the output signal FB_out is added to the coarse bit signal CB before being input into the oscillator 1006, there is only one control signal, the OSC_code signal, to directly control the oscillator 1006. The OSC_code signal contains both coarse and fine information. Since there is only one control signal, the oscillator 1006 can avoid the non-monotonic problem.

Figure 11:
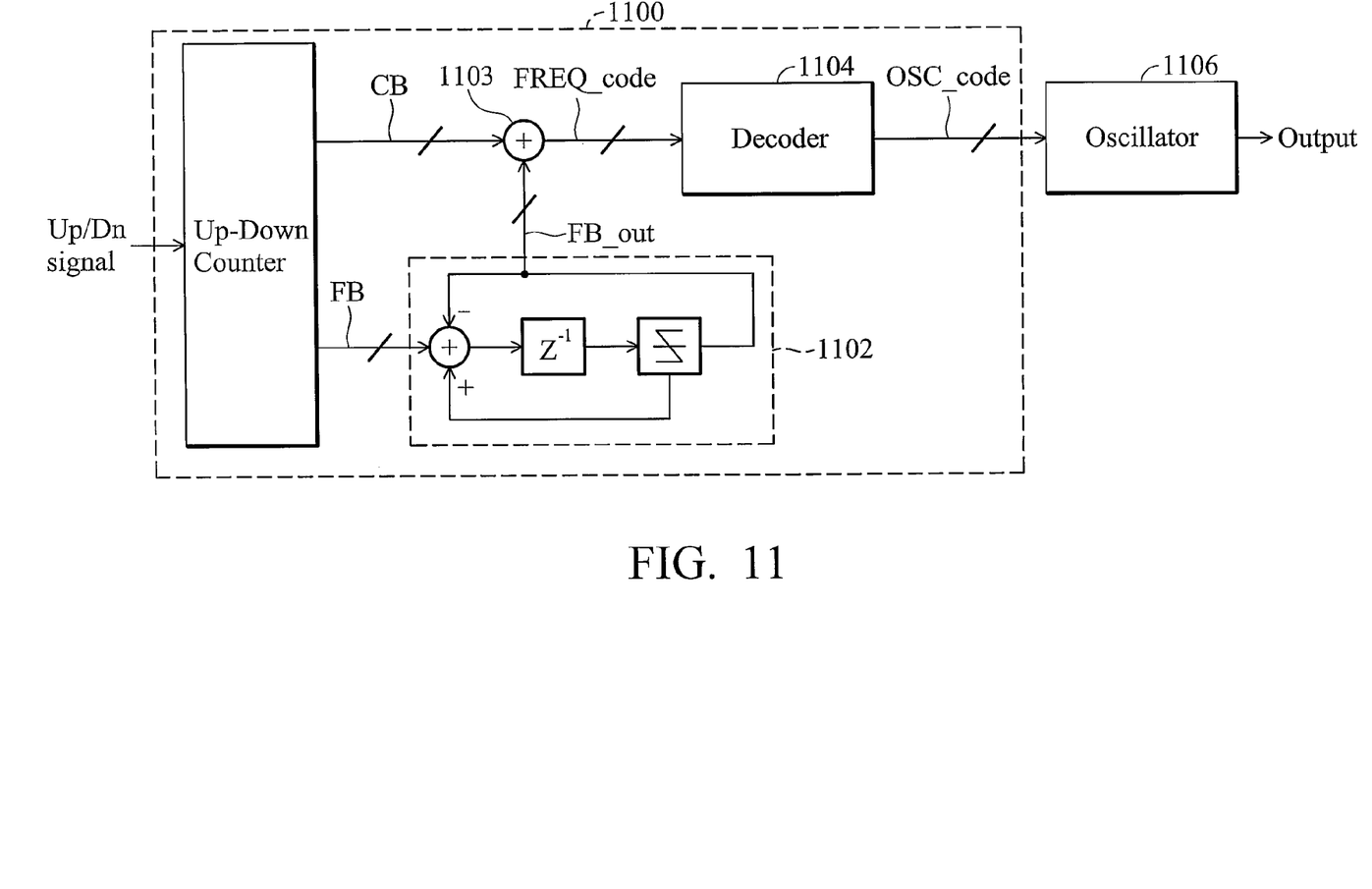
FIG. 11 shows an embodiment of the circuit shown in FIG. 10.

FIG. 11 shows an embodiment of the circuit shown in FIG. 10. The circuit 1100 for providing digital control codes to control an oscillator 1106 comprises a delta-sigma modulator 1102, an adder 1103, and a decoder 1104. The delta-sigma modulator 1102 is implemented by a first order delta-sigma modulator. The OSC_code signal contains both coarse and fine information.

Figure 1A:
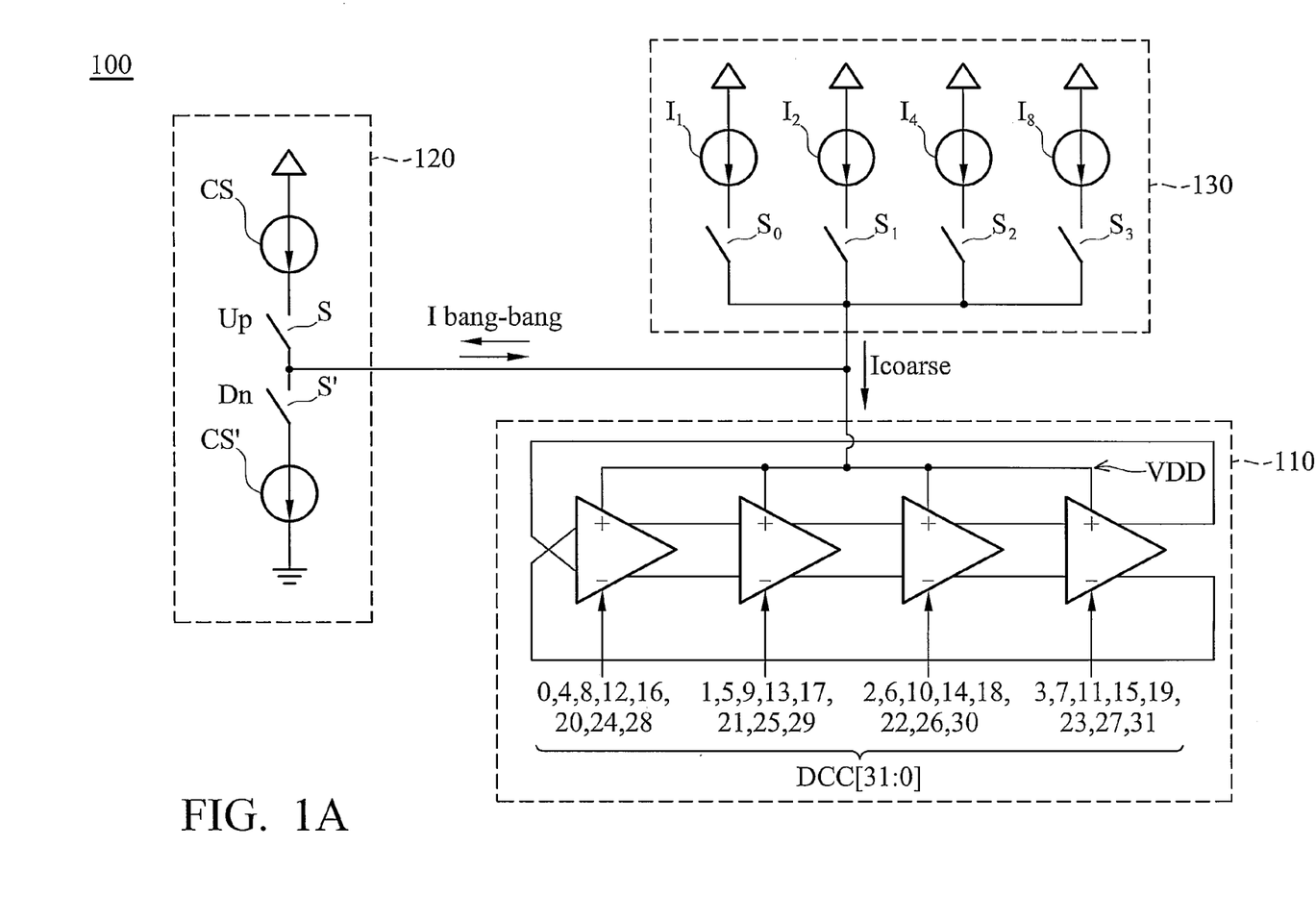
FIG. 1A is a block diagram of a mixed mode controlled oscillator according to an embodiment of the invention.

FIG. 1A is a block diagram of a mixed mode controlled oscillator and a circuit for controlling the mixed mode controlled oscillator according to an embodiment of the invention. The circuit 100 for controlling a mixed mode controlled oscillator 110 comprises a charge pump 120, a coarse tuning control unit 130, and a digital loop filter 220 (shown in FIG. 2). The mixed mode controlled oscillator 110 receives digital control codes DCC[31:0] from the digital loop filter 220. The charge pump 120 is coupled to the mixed mode controlled oscillator 110 and pushes/pulls a current from the mixed mode controlled oscillator 110. More specifically, the charge pump 120 comprises a first current source CS and a first switch S coupled between a supply voltage and the mixed mode controlled oscillator 110 and a second current source CS' and a second switch S' coupled between a ground and the mixed mode controlled oscillator 110. The coarse tuning control unit 130 is coupled to the mixed mode controlled oscillator 110 and provides a coarse tune control signal thereto. More specifically, the coarse tuning control unit 130 is a current digital to analog converter (DAC) and the coarse tune control signal is a coarse tune current Icoarse, as shown in FIG. 1A. The current DAC comprises four current sources 11, 12, 14, and 18 coupled between a power supply voltage and the mixed mode controlled oscillator 110 and four switches S0, S1, S2 and S3 each coupled between a corresponding current source and the mixed mode controlled oscillator 110. The relationship of current associated with the current sources I1, I2, I4, and I8 obeys an exponent of two and each of the switches S0, S1, S2 and S3 is controlled by a binary signal. An output frequency of the mixed mode controlled oscillator 110 is controlled according to the coarse tune control signal and the digital control code DCC [31:0].

Figure 1B:
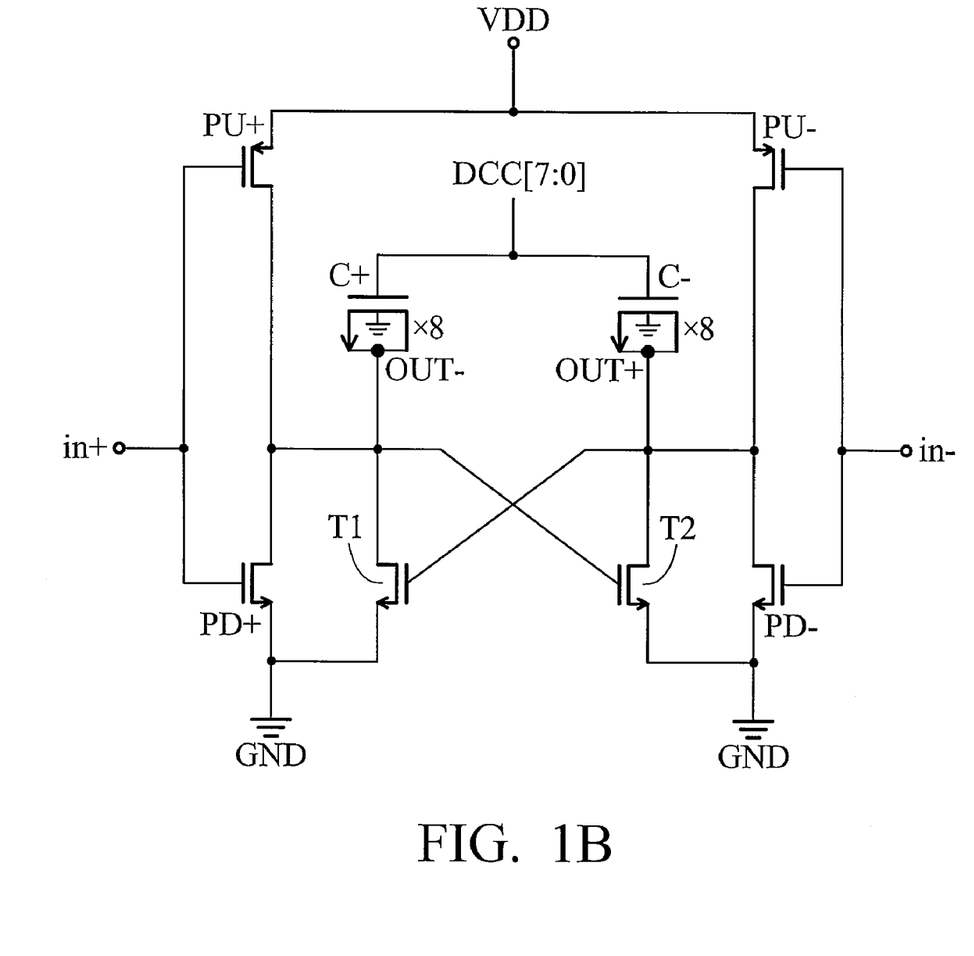
FIG. 1B is an exemplary circuit of the mixed mode controlled oscillator 110 in FIG. 1A.

FIG. 1B is an exemplary circuit of the mixed mode controlled oscillator 110 in FIG. 1A. In this embodiment, the mixed mode controlled oscillator 110 comprises a pair of inverters each having a pull-up device PU+/PU− and a pull-down device PD+/PD− connected in series between a power supply node VDD and a ground GND, a pair of MOS transistors T1/T2 having sources thereof coupled to those of the pull-down devices PD+/PD−, and gates cross-coupled to drains thereof, and a pair of MOS capacitors C+/C− having gates thereof receiving the digital controlled code DCC [7:0] and source/drains thereof respectively coupled to the drains of the MOS transistors T1/T2.

Figure 13:
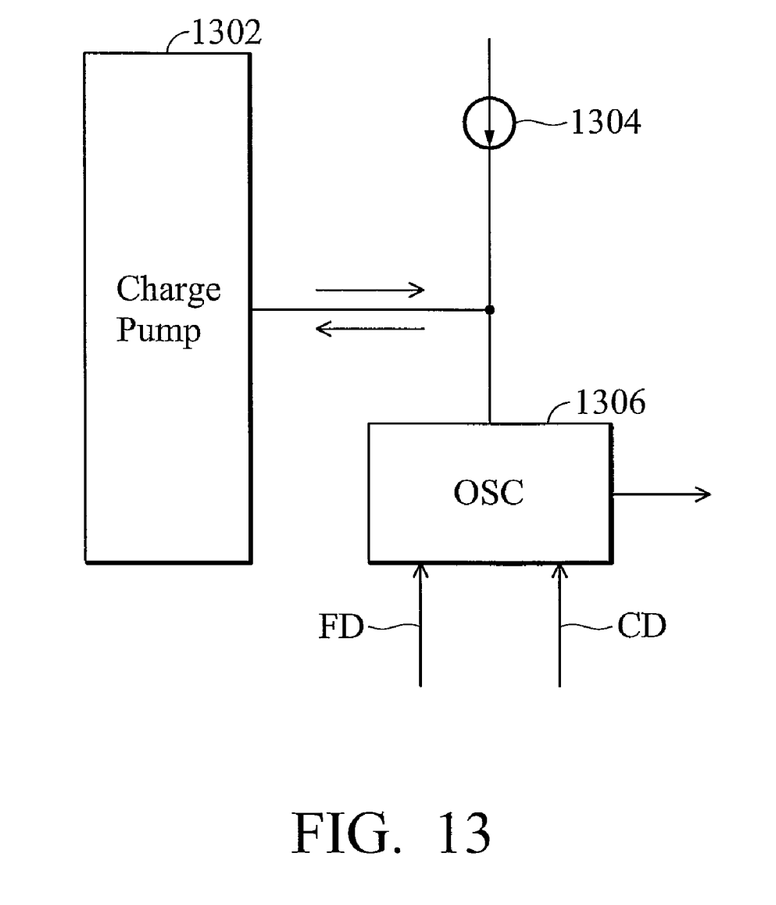
FIG. 13 shows another example of a mixed mode controlled oscillator and a circuit for controlling the mixed mode controlled oscillator according to an embodiment of the invention.

FIG. 13 shows another example of a mixed mode controlled oscillator and a circuit for controlling the mixed mode controlled oscillator according to an embodiment of the invention. With reference to FIG. 13, the current source 1304 has a fixed current value. Compared with the embodiment in FIG. 1A, the coarse tuning control unit 130 of FIG. 1A is omitted in FIG. 13. The coarse tuning function is integrated into the mixed mode controlled oscillator 1306. The mixed mode controlled oscillator 1306 receives a fine digital code FD and a coarse digital code CD. The fine digital code FD is used to fine tune the output frequency of the mixed mode controlled oscillator 1306. The coarse digital code CD is used to coarse tune the output frequency of the mixed mode controlled oscillator 1306. The mixed mode controlled oscillator 1306 is controlled both by an analog signal (a current signal from the charge pump 1302) and by a digital code (the fine digital code FD and the coarse digital code CD).

Figure 14:
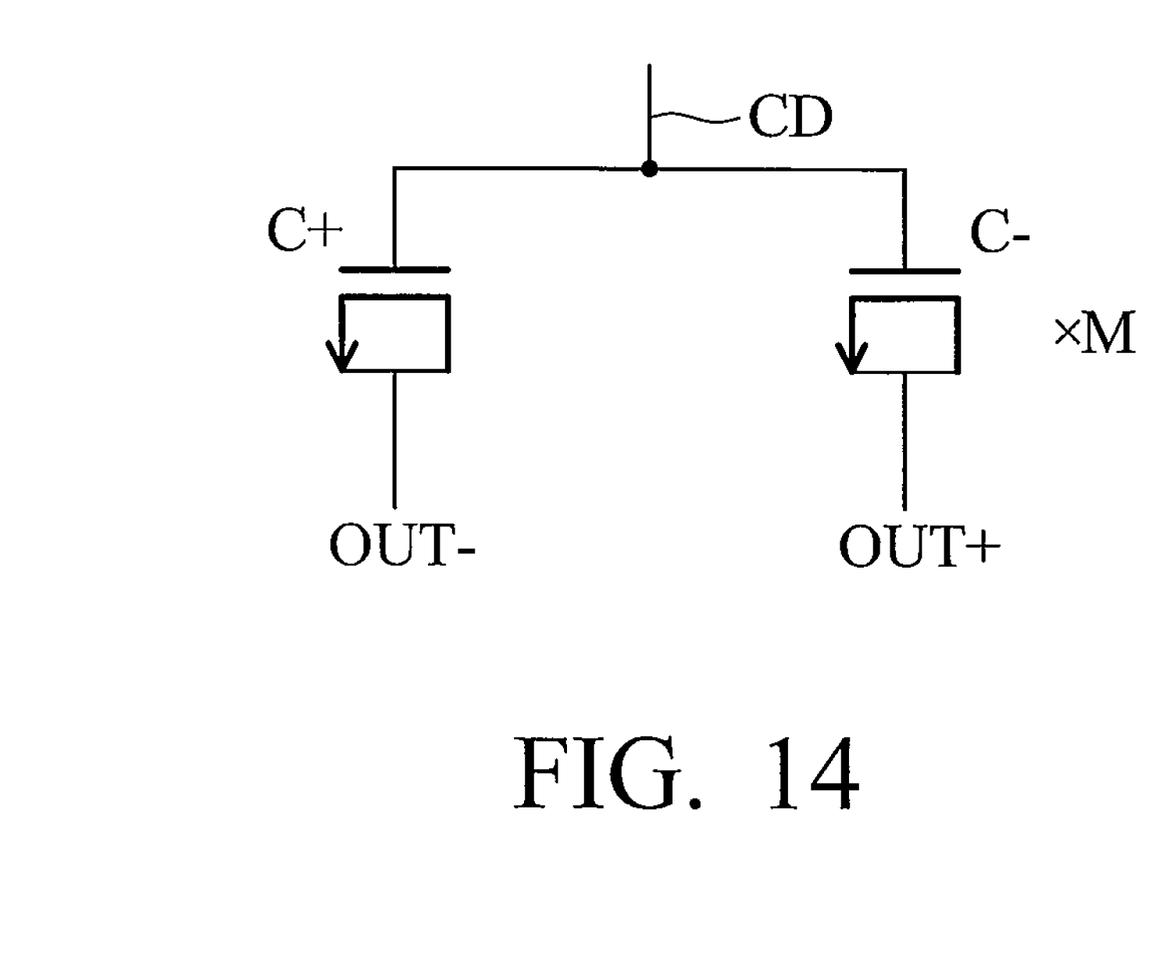
FIG. 14 shows an embodiment of implementing the coarse tune function in the mixed mode controlled oscillator.

FIG. 14 shows an embodiment of implementing the coarse tune function in the mixed mode controlled oscillator 1306. The fine digital code FD is used to control the capacitors implemented by the circuits shown in FIG. 1B. The coarse digital code CD is used to control the capacitors implemented by the circuits shown in FIG. 14, wherein the capacitance value of each capacitor shown in FIG. 14 is much larger than that shown in FIG. 1B. By switching on/off the larger capacitors, the mixed mode controlled oscillator 1306 is able to coarse tune the output frequency. With M set of capacitors, a M-level coarse tuning of frequency can be achieved. The set of capacitors shown in FIG. 14 can be regarded as a coarse tuning control unit and can be deemed within or outside a mixed mode controlled oscillator.

Figure 2:
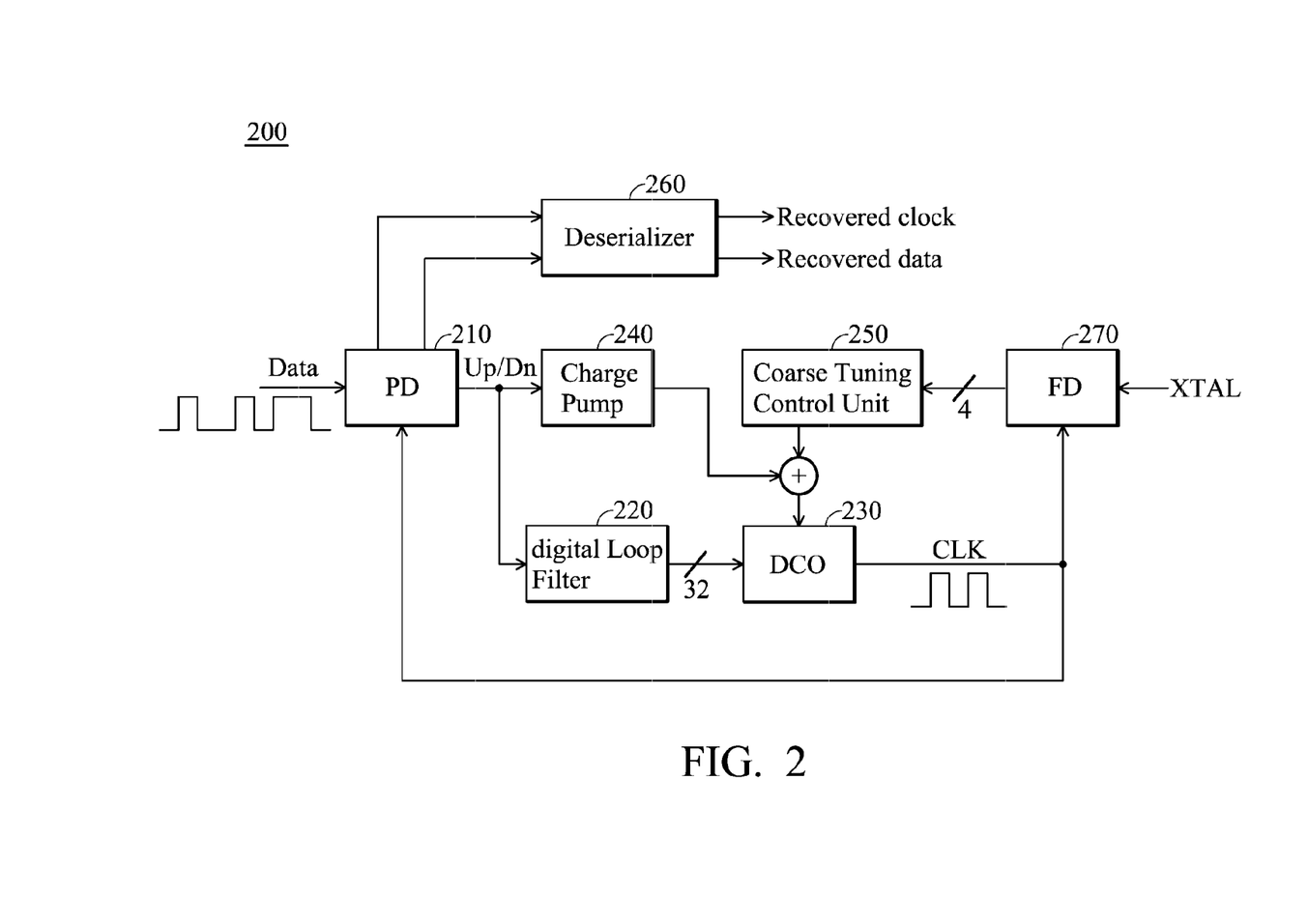
FIG. 2 is a block diagram of a clock data recovery (CDR) circuit according to an embodiment of the invention.

FIG. 2 is a block diagram of a clock data recovery (CDR) circuit according to an embodiment of the invention. The CDR circuit comprises a phase detector 210, a digital loop filter 220, a mixed mode controlled oscillator 230, a charge pump 240, and a coarse tuning control unit 250. The phase detector 210 generates an up/down signal Up/Dn. The digital loop filter 220 receives the up/down signal Up/Dn and generates a digital control code. The mixed mode controlled oscillator 230 receives the digital control code. Preferably, the mixed mode controlled oscillator 230 is constructed as shown in FIG. 1B. The charge pump 240 is coupled to the mixed mode controlled oscillator 230 and pushes/pulls a current from the mixed mode controlled oscillator 230 according to the up/down signal Up/Dn. The coarse tuning control unit 250 is coupled to the mixed mode controlled oscillator 230 and provides a coarse tune control signal thereto. Preferably, the coarse tuning control unit 250 is a current DAC, as shown in FIG. 2. An output frequency of the mixed mode controlled oscillator 230 is controlled according to the coarse tune control signal and the digital control code. More specifically, the CDR circuit can further comprise a frequency detector 270 coupled to the coarse tuning control unit (the current DAC) 250, the mixed mode controlled oscillator 230 and the phase detector 210. In addition, the CDR circuit may further comprises a deserializer 260 coupled to the phase detector 210 such that data and clock are recovered.

Figure 3:
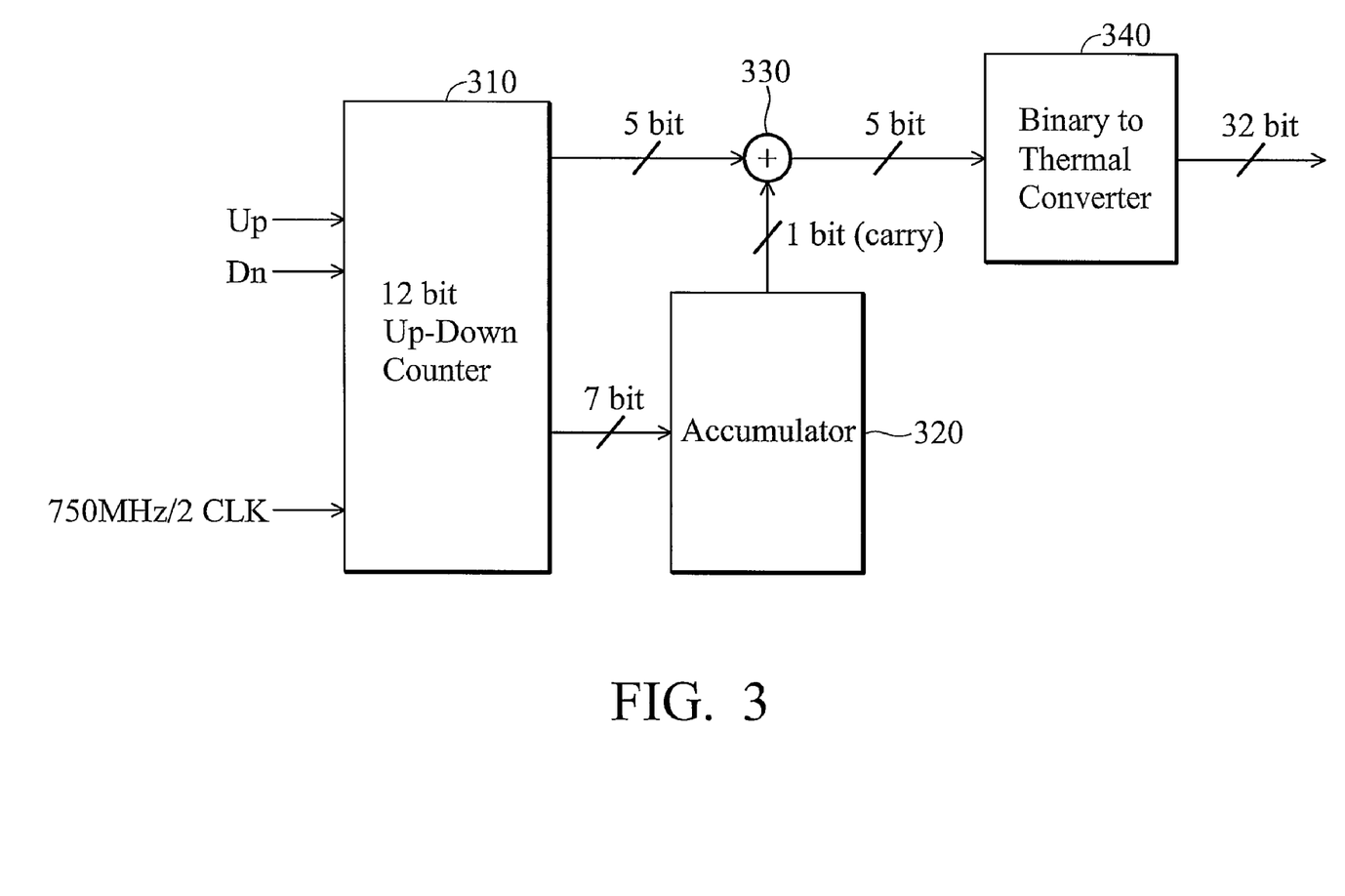
FIG. 3 is a block diagram of the digital loop filter 220 in FIG. 2.

FIG. 3 is an exemplary block diagram of the digital loop filter 220 in FIG. 2. The digital loop filter comprises an up/down counter 310, an accumulator 320, an adder 330, and a binary to thermal converter 340. The up/down counter 310 receives the up/down signal Up and Dn and generates a 5-bit signal and a 7-bit signal. The accumulator 320 receives the 7-bit signal from the up/down counter 310 and generates a 1-bit signal. The adder 330 receives the 5-bit signal from the up/down counter 310 and the 1-bit signal from the accumulator 320 and generates a 5-bit signal. The binary to thermal converter 340 receives the 5-bit signal from the adder 330 and generates a 32-bit digital control code.

The mixed mode controlled oscillator 230 in FIG. 2 provides a system clock via control signals from a coarse tuning control unit 250 by switching the current sources therein, an analog proportional path from the charge pump 240, and a digital controlled path from the digital loop filter 220.

The output frequency of the digital controlled oscillator is determined by the current injected into the power supply node and capacitance of the MOS capacitors. The switching current sources are controlled by a 4-bit frequency detection counter which provides the binary signals to the switches S0, S1, S2, and S3 in FIG. 1A.

There is an analog feed forward path via the charge pump 240 in FIG. 2. The charge pump 240 receives phase error from the phase detector 210 and pushes/pulls current from the mixed mode controlled oscillator 230 to make phase correction.

There is also a digital control part achieved by switching NMOS capacitors as shown in FIG. 1B. The thermal controlling codes from the digital loop filter control the NMOS capacitors in the mixed mode controlled oscillator and adjust loadings associated therewith. When the control bit goes from low to high, the loading associated with the digital controlled oscillator is increased, thus lowering the output frequency thereof. The digital controlled oscillator inherently is provided with good power supply rejection ratio (PSRR). When the voltage at the power supply node VDD increases, the current injection into the digital controlled oscillator is also increased due to channel length modulation of the current sources. Meanwhile, the load capacitance is also increased due to increased Vgs of the NMOS capacitors. Influences of the two factors cancel each other and good PSRR is thus resulted.

When the output clock frequency is much lower/higher than the target frequency, the current injected into the digital controlled oscillator is increased/decreased based on results of the digital frequency detector. After frequency is locked, the system is switched to data recovery path automatically. The phase detector samples incoming data according to IQ clock phases and generated early/late information. The information is transferred to the digital controlled oscillator via a feed forward charge pump. The charge pump utilizes the current controlled characteristics and pushes/pulls current from the digital controlled oscillator to make phase correction.

While the invention has been described by way of example and in terms of preferred embodiment, it is to be understood that the invention is not limited thereto. To the contrary, it is intended to cover various modifications and similar arrangements as would be apparent to those skilled in the Art. Therefore, the scope of the appended claims should be accorded the broadest interpretation so as to encompass all such modifications and similar arrangements.

What is claimed is:

1. A circuit for controlling a mixed mode controlled oscillator, the circuit comprising:
    a phase detector to output an up/down signal;
    a charge pump coupled to the mixed mode controlled oscillator, the charge pump receiving the up/down signal and sending a current signal directly to the mixed mode controlled oscillator; and
    a digital loop filter receiving the up/down signal and generating a digital code signal to the mixed mode controlled oscillator;
    wherein an output frequency of the mixed mode controlled oscillator is controlled by both the current signal and the digital code signal simultaneously.

2. The circuit as claimed in claim 1, further comprising a coarse tuning control unit coupled to the mixed mode controlled oscillator and a frequency detector, the coarse tuning control unit sending a coarse tune current to the mixed mode controlled oscillator to coarse tune the output frequency of the mixed mode controlled oscillator.

3. The circuit as claimed in claim 2, wherein the coarse tuning control unit is a current DAC providing the coarse tune current to a power supply node of the mixed mode controlled oscillator.

4. The circuit as claimed in claim 2, wherein the coarse tuning control unit comprises capacitors controlled by a coarse digital code.

5. The circuit as claimed in claim 1, wherein the digital loop filter comprises an up/down counter receiving the up/down signal, an accumulator coupled to the up/down counter, an adder coupled to the up/down counter and the accumulator, and a binary to thermal converter coupled to the adder and generating the digital code signal.

6. A method for controlling a mixed mode controlled oscillator, the method comprising:
    providing an up/down signal by a phase detector;
    generating a current signal by a charge pump according to the up/down signal;
    sending the current signal directly to the mixed mode controlled oscillator;
    generating a digital code signal by a digital loop filter according to the up/down signal; and
    controlling an output frequency of the mixed mode controlled oscillator based on both the current signal and the digital code signal simultaneously.

7. The method as claimed in claim 6, further comprising coarse tuning the output frequency of the mixed mode controlled oscillator by a coarse tuning control unit.

8. The method as claimed in claim 7, wherein the coarse tuning control unit is a current DAC providing a coarse tune current to a power supply node of the mixed mode controlled oscillator.

9. The method as claimed in claim 7, wherein the coarse tuning control unit comprises capacitors controlled by a coarse digital code.

10. A clock data recovery (CDR) circuit, comprising:
    a phase detector generating an up/down signal;
    a digital loop filter receiving the up/down signal and generating a digital code signal;
    a mixed mode controlled oscillator receiving the digital control code;
    a charge pump coupled to the mixed mode controlled oscillator, the charge pump sending a current signal directly to the mixed mode controlled oscillator according to the up/down signal; and
    a coarse tuning control unit coupled to the mixed mode controlled oscillator and a frequency detector, the coarse tuning control unit coarse tuning an output frequency of the mixed mode controlled oscillator;
    wherein the output frequency of the mixed mode controlled oscillator is controlled by all of the current signal, the coarse tuning control unit, and the digital control code simultaneously.

11. The CDR circuit as claimed in claim 10, wherein the mixed mode controlled oscillator comprises a pair of inverters each having a pull-up device and a pull-down device connected in series between a power supply node and a ground, a pair of MOS transistors having sources thereof coupled to those of the pull-down devices, and gates cross-coupled to drains thereof, and a pair of MOS capacitors having gates thereof receiving the digital controlled code and source/drains thereof respectively coupled to the drains of the MOS transistors.

12. The CDR circuit as claimed in claim 11, wherein the coarse tuning control unit is a current DAC providing a coarse tune current to the power supply node of the mixed mode controlled oscillator.

13. The CDR circuit as claimed in claim 11, wherein the coarse tuning control unit comprises capacitors controlled by a coarse digital code.

14. The CDR circuit as claimed in claim 13, further comprising a frequency detector coupled to the current DAC, the mixed mode controlled oscillator and the phase detector.

15. The CDR circuit as claimed in claim 10, wherein the digital loop filter comprises an up/down counter receiving the up/down signal, an accumulator coupled to the up/down counter, an adder coupled to the up/down counter and the accumulator, and a binary to thermal converter coupled to the adder and generating the digital code signal.

* * * * *